United States Patent [19]

Perman

[11] Patent Number: 4,803,432

[45] Date of Patent: Feb. 7, 1989

[54] SHORT ECHO NMR IMAGING OF SODIUM

[75] Inventor: William H. Perman, Fitchburg, Wis.

[73] Assignee: Wisconsin Alumni Research Foundation, Madison, Wis.

[21] Appl. No.: 85,408

[22] Filed: Aug. 13, 1987

[51] Int. Cl.$^4$ .............................................. G01R 33/20
[52] U.S. Cl. ....................................... 324/309; 324/307
[58] Field of Search ....................... 324/309, 307, 312; 128/653

[56] References Cited

U.S. PATENT DOCUMENTS 4,409,550  10/1983  Fossel et al. ...................... 324/309
4,506,223   3/1985  Bottomley et al. ................ 324/309
4,715,383  12/1987  Ehman ............................... 128/653

Primary Examiner—Michael J. Tokar
Assistant Examiner—Louis M. Arana
Attorney, Agent, or Firm—Quarles & Brady

[57] ABSTRACT

An NMR pulse sequence includes a nonselective RF excitation pulse followed by one or more nonselective echo RF pulses which produce NMR echo signals at echo times starting at TE=2.5 milliseconds. This short echo time enables paramagnetic nuclei having short $T_2$ relaxation components, such as sodium$^{23}$, to be measured and imaged. Presaturation pulses at the beginning of the NMR pulse sequence serve as an alternative to slice selection.

6 Claims, 4 Drawing Sheets

SHORT ECHO NMR IMAGING OF SODIUM

BACKGROUND OF THE INVENTION

The field of the invention is nuclear magnetic resonance (NMR) techniques for measuring the properties of materials and producing images.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus).

When a substance such as human tissue is subjected to a uniform magnetic field (polarizing field $B_0$), the individual magnetic moments of the paramagnetic nuclei in the tissue attempt to align with this field, but precess about it in random order at their characterisitic Larmor frequency. A net magnetic moment $M_z$ is produced in the direction of the polarizing field, but the randomly oriented components in the perpendicular plane (x-y plane) cancel on another. If, however, the substance, or tissue, is irradiated with a magnetic field (excitation field $B_1$) which is in the x-y plane and which is near the Larmor frequency, the net aligned moment, $M_z$, can be rotated into the x-y plane to produce a net transverse magnetic moment $M_1$ which is rotating in the x-y plane at the Larmor frequency.

The practical value of this gyromagnetic phenomena resides in the radio signal which is emitted after the excitation signal $B_1$ is terminated. When the excitation signal is removed, an oscillating sine wave is induced in a receiving coil by the rotating field produced by the transverse magnetic moment $M_1$. The frequency of this signal is the Larmor frequency, and its initial amplitude, $A_0$, is determined by the magnitude of $M_1$. The amplitude A of the emission signal (in simple systems) decays in an exponential fashion with time, t:

$$A = A_0 e^{-t/T^*_2}$$

The decay constant $1/T^*_2$ depends on the homogeneity of the magnetic field and on the $T_2$ of the particular nuclei which is referred to as the "spin-spin relaxation" constant, or the "transverse relaxation" constant. The $T_2$ constant is inversely proportional to te exponential rate at which the aligned precession of the nuclei dephase after the removal of the excitation signal $B_1$. The measurement of $T_2$ or the modulation of NMR signals by $T_2$ effects provides valuable information about the substance under study.

Other factors contribute to the amplitude of the free induction decay (FID) signal which is defined by the $T_2$ spin-spin relaxation process. One of these is referred to as the spin-lattice relaxation process which is characterized by the time constant $T_1$. This is also called the longitudinal relaxation process as it describes the recovery of the net magnetic moment M to its equilibrium value $M_O$ along the axis of magnetic polarization (Z). The $T_1$ time constant is longer than $T_2$, much longer in most substances, and its independent measurement is the subject of many procedures.

The measurements described above are called "pulsed NMR measurements." They are divided into a period of excitation and a period of emission. As will be discussed in more detail below, this measurement cycle may be repeated many times to accumulate different data during each cycle or to make the same measurement at different locations in the subject.

Although NMR measurements are useful in many scientific and engineering fields, their primary use is in the field of medicine. NMR measurements provide a contrast mechanism which is quite different from X-rays, and this enables difference between soft tissues to be observed with NMR which are completely indiscernible with X-rays. In addition, physiological differences can be observed with NMR measurements, whereas X-rays are limited particularly to anatomical studies.

For most medical applications utilizing NMR, an imaging technique must be employed to obtain information at specific locations in the subject. The foremost NMR imaging technique is referred to as "zeugmatography" and was first proposed by P. C. Lauterbur in a publication "Image Formation by Induced Local Interactions: Examples Employing Nuclear Magnetic Resonance", *Nature*, Vol. 242, Mar. 16, 1973, pp. 190-191. Zeugmatography employs one or more additional magnetic fields which have the same direction as the polarizing field $B_0$, but which have a nonzero gradient. By varying the strength (G) of these gradients, the net strength of the polarizing field $B_0 = B_z + G_x X + G_y Y + G_z Z$ at any location can be varied. As a result, if the frequency response of the receiver coil and circuitry is narrowed to respond to a single frequency, $\omega_0$, then gyromagnetic phenomena will be observed only at a location where the net polarizing field $B_0$ is of the proper strength to satisfy the Larmor equation; $\omega_0 = \gamma B_0$: where $\omega_0$ is the Larmor frequency at that location.

By "linking" the resulting NMR signal with the strengths of the gradients ($G = G_x, G_y, G_z$) at the moment the signal is generated, the NMR signal is "tagged", or "sensitized", with position information. Such position sensitizing of the NMR signal enables an NMR image to be reconstructed from a series of measurements. Such NMR imaging methods have been classified as point methods, line methods, plane methods and three dimensional methods. These are discussed, for example, by P. Mansfield and P. G. Morris in their book *NMR Imaging in Biomedicine* published in 1982 by Academic Press, New York.

The NMR scanners which implement these techniques are constructed in a variety of sizes. Small, specially designed machines are employed to examine laboratory animals or to provide images of specific parts of the human body. On the other hand, "whole body" NMR scanners are sufficiently large to receive an entire human body and produce an image of any portion thereof.

The NMR behavior of the sodium-23 nucleus in vivo is a complex problem which has generated considerable medical interest. The sodium cation is one of the most abundant ions in the human body, second only to the hydrogen nucleus in local concentration. There are major differences between concentrations of sodium in the intracellular cytoplasm and in the cell nucleus. The sodium concentration gradient between intracellular and extracellular sodium is maintained by the sodium potassium pump. This close relationship between intracellular and extracellular sodium concentration with membrane permeability and the adenosine triphosphate powered Na-K pump makes sodium a sensitive indicator of cellular change and death.

Initially, NMR measurements of sodium were performed on continuous wave spectrometers using excised tissue samples. These studies compared the total sodium in the tissue as determined from the NMR measurement with the total sodium determined by ashing the tissue. These studies found that approximately 60% of the total sodium was not detected using the NMR measurement technique. Further study revealed that the sodium nucleus exhibited a two component $T_2$ relaxation constant. This bi-exponential $T_2$ relaxation has a short component of from 0.7 to 4.8 milliseconds and a long component of from 7.0 to 26 milliseconds. This two component $T_2$ relaxation process is thought to originate from quadrupolar interactions of the sodium nucleus with the surrounding electric fields. The short component is estimated to be attributable to 62% to 68% of the total sodium present in the tissue. The discrepancy in prior NMR measurements of sodium is, therefore, due to the inability to produce an NMR signal quickly enough to measure the short component.

SUMMARY OF THE INVENTION

The present invention relates to an NMR method for measuring and imaging nuclei which exhibit a very short $T_2$ relaxation constant or component thereof. More specifically, the present invention relates to the imaging of sodium nuclei using a pulse sequence in which a nonselective 90° RF excitation pulse of very short duration is employed to produce transverse magnetization and a plurality of spin echo NMR signals are produced by applying a corresponding series of nonselective 180° RF echo pulses. At least one of the spin echo NMR signals is produced within the $T_2$ relaxation time of the excited nuclei.

A general object of the invention is to provide an NMR image of sodium. By employing an exceedingly fast pulse sequence, an NMR signal is produced before the signal component which decays according to the short relaxation component $T'_2$ has decayed significantly. As a result, the NMR signals more accurately reflect the conentration of sodium, and a more accurate sodium concentration image can be reconstructed.

Another general object of the invention is to provide multiple sodium images at very short spin echo times. These images will allow the investigator to determine the degree of quadrupolar interaction of the sodium nuclei by noting the amount of short $T_2$ relaxation. Also, there will be apparent concentration changes between short echo images as the short $T_2$ relaxation component decays away. In this manner, comparison of sodium echo images at 2.5 or 3.0 msec versus 10.0 msec also allows the investigator to estimate the relative amount of short $T_2$ sodium present in each image voxel. The degree of short $T_2$ sodium present may have important physiological and medical implications.

Another object of the invention is to provide a very short echo pulse sequence. To accomplish this, the RF excitation and RF echo pulses are very short in duration and the spacing between RF pulses is minimized. As a result, the first spin echo NMR signal is produced well with in the 0.7 to 4.8 millisecond time constant of the short $T_2$ component of sodium.

Another object of the invention is to provide an imaging pulse sequence which employs nonselective RF pulses. Because nonselective RF pulses are employed for maximum speed, the conventional slice select method used for imaging cannot be employed. Instead, the method of the present invention employs presaturation pulses before application of the nonselective 90° excitation which saturate the sodium nuclei on both sides of the slice to be imaged. As a result, the sodium nuclei outside the slice do not contribute to the spin echo NMR signals even though they are subjected to the 90° RF excitation pulse and the 180° RF echo pulses.

Yet another object of the invention is to apply the required RF energy in the shortest time possible. Since the amount of RF energy needed to produce a 90° tip, the peak RF power delivered to the subject must be maximized in order to reduce RF pulse duration. This is accomplished in the present invention by employing quadrature RF excitation fields in the NMR instrument.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
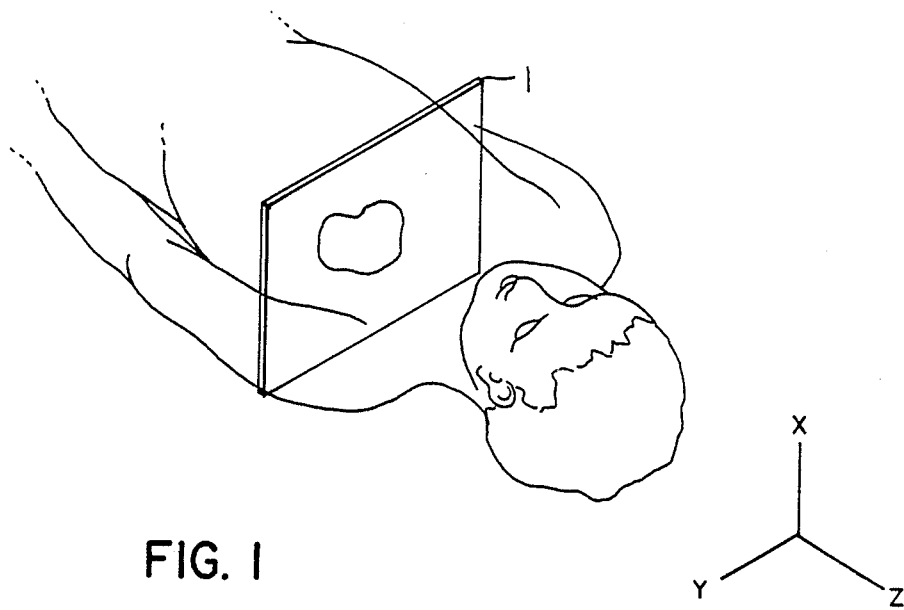
FIG. 1 is a pictoral view of a patient which shows an image that may be formed using the NMR method of the present invention.

Referring particularly to FIG. 1, the present invention is embodied in a full body NMR imaging system which is capable of receiving a patient and producing a two-dimensional image at a slice, or cross section, taken through the patient. The position and orientation of the slice, which is to be imaged, is determined by the magnitude of magnetic field gradients applied along the respective X, Y, and Z axes of the NMR imaging system. A slice 1 is shown in FIG. 1, which is taken through the patient's heart, although the magnetic field gradients can be controlled to produce an image through any section or volume and from any desired orientation.

Figure 2:
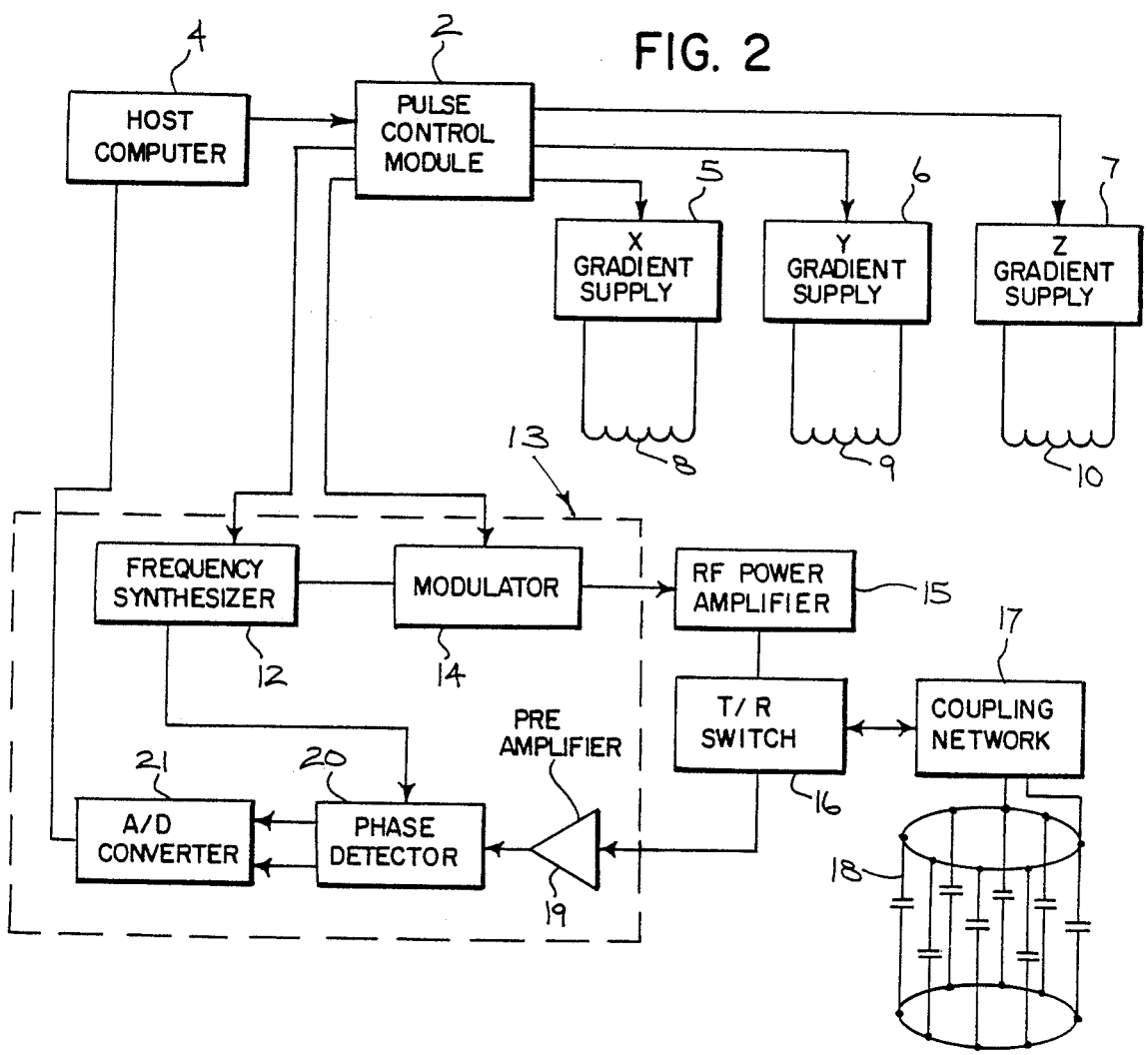
FIG. 2 is an electrical block diagram of an NMR system which employs the present invention.

The preferred embodiment of the invention has been incorporated in an NMR imaging system which is commercially available from the General Electric Company and is sold under the trademark "Signa". This system produces a 1.5 Tesla polarizing magnetic field $B_0$ FIG. 2 is a simplified block diagram of this NMR imaging system. The system includes a pulse control module 2 which receives command signals from a host computer 4. The pulse control module 2 provides properly timed pulse waveform signals to magnetic field gradient power supplies 5, 6 and 7 which energize respective gradient coils 8, 9 and 10 forming part of a gradient coil assembly which surrounds the patient. The gradient coils 8, 9 and 10 produce the $G_x$, $G_y$, and $G_z$ magnetic fields in the direction of the polarizing magnetic field $B_0$, but with gradients directed in the x, y and z directions, respectively. The use of the $G_x$, $G_y$ and $G_z$ gradients in NMR imaging applications is well known in the art, and the specific use in the present invention will be described in more detail below.

Referring still to FIG. 2, the pulse control module 2 also provides activating pulses to an RF frequency synthesizer 12, which is part of an RF transceiver system which is indicated generally by dash-line 13. The pulse contol module 12 also supplies modulating signals to a modulator 14 which modulates the output of the RF frequency synthesizer 12. The RF signals are applied through an RF power amplifier 15 and a transmit/receive switch 16 to a coupling network 17. The coupling network 17 produces two phase displaced RF signals which are applied to an excitation coil 18. The excitation coil 18 is constructed as described in U.S. Pat. No. 4,680,548, which issued on July 14, 1987 and is entitled "Radio Frequency Field Coil For NMR". The two phase displaced RF signals are applied to the coil 18 such that the RF excitation field $B_1$ produced by the coil 18 has two orthogonal components. Such a quadrature RF drive arrangement has been found to be a more efficient means for delivering the RF energy to the paramagnetic nuclei and, hence, a means for further shortening the duration of the RF pulses while still producing the required tip of the net magnetization. In the preferred embodiment, the two orthogonal resonant modes of the coil 18 are at 16.875 and 16.886 Hz with a loaded Q, or quality factor, of 201 and 196, respectively.

Under the direction of the pulse control module 2, the center frequency and the modulation of the RF excitation pulses are controlled to produce the desired transverse excitation. The duration and amplitude of the RF pulse determine the amount which the net magnetization is tipped. As will be described below, in the preferred embodiment of the invention tip angles of 90° and 180° are employed. In addition, the RF pulse may be either modulated or unmodulated. When the RF pulse is modulated, it is used in combination with a magnetic field gradient, usually $G_z$, to excite spin in a selected region or slice of the patient. The RF pulse bandwidth together with the selection gradient strength determine the slice thickness, the modulation of the RF pulse together with the strength of the gradient determine the slice offset. This slice select method using a "selective" RF pulse is described in U.S. Pat. No. 4,431,968, which issued on Feb. 4, 1984 and is entitled "Method of Three-Dimensional NMR Imaging Using Selective Excitation". On the other hand, when the RF excitation pulse is not modulated, its center frequency is set to the Larmor frequency of the spin in the region of interest. For example, if no magnetic field gradients are applied, the unmodulated RF pulse will excite the entire region within the coil 18. Such unmodulated RF pulses are referred to in the art as "nonselective," since they do not occupy a frequency spectrum which serves to excite spin over a selected volume.

One aspect of the present invention is the recognition that selective RF pulses cannot be used in the conventional slice select method. This is because as the duration of the selective RF pulse is shortened the power requirement to achieve a pulse flip angle of 90° increases proportional to the lost area (duration x height of waveform, the modulating waveform is usually a sin x/x or sinc waveform). Furthermore, as the frequency bandwidth of the selective RF pulse increases due to the decreasing RF pulse width, the selection gradient must be proportionally increased to provide the same slice thickness. The maximum available selection gradient on most current production NMR scanners is 10 mT/m, and for a normal 10.0 mm slice with a typical RF pulse width of 3.2 msec for a sinc RF waveform having four cycles, the gradient necessary to provide a 10 mm slice is 6 mT/m. Thus, if the same RF waveform is employed and the RF pulse width is decreased from 3.2 to 0.21 msec, a selection gradient of (6 mT/m)*(3.2/0.21)=91 mT/m is required and is outside the maximum available gradient. As will be described below, another method must therefore be used in place of the conventional slice select technique.

Referring to FIG. 2, the NMR signals from the excited nuclear spins are sensed by the RF coil 18 and applied through the transmit/receive switch 16 to an RF preamplifier 19. The amplified NMR signals are applied to a quadrature phase detector 20 and the detected signals are digitized by A/D converter 21 and applied to computer 4 for storage and processing in a well known manner. A typical pulse sequence includes the application of one or more RF pulses to the coil 18 with the switch 16 set to transmit, followed by the receipt of one or more NMR signals with the switch 16 set to receive.

Figure 3:
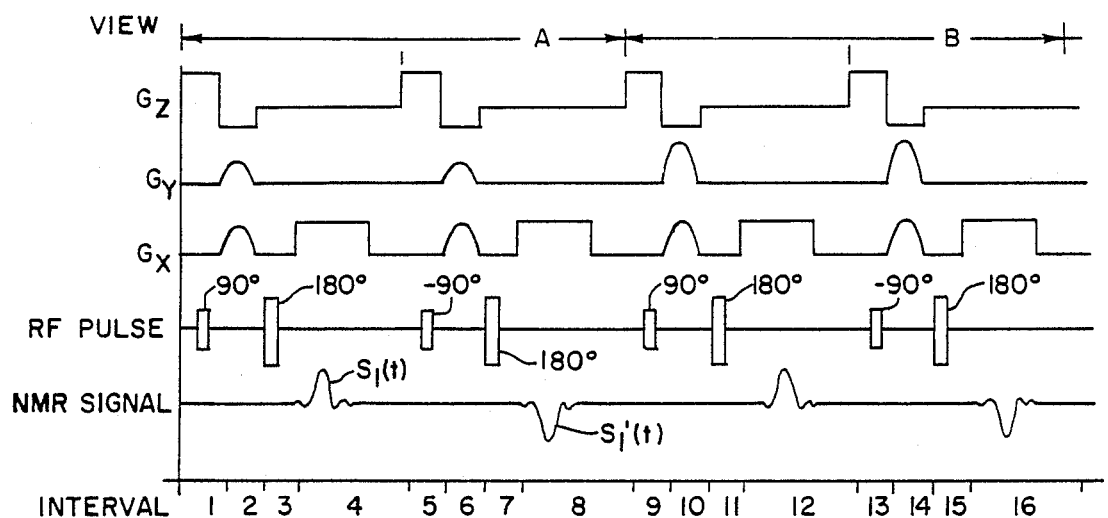
FIG. 3 is an exemplary prior art NMR imaging pulse sequence which is employed by the system of FIG. 2.

Reference is made to FIG. 3, which shows two "views" of an imaging pulse sequence of the type known in the art as two-dimensional Fourier transform (2DFT), and which is frequently also referred to as two-dimensional "spin-warp." This pulse sequence is useful in imaging hydrogen nuclei. The two views are indicated at "A" and "B" and each view is identical with the exception of the phase encoding gradient field $G_y$. Each view is a pulse sequence which utilizes phase alternated RF excitation pulses $B_1$ which, as disclosed in U.S. Pat. No. 4,443,760, produce phase alternated NMR signals $S_1(t)$ and $S_1'(t)$ to cancel certain baseline errors in the NMR system.

Referring to View A in FIG. 3, there is shown in interval 1 (indicated along the horizontal axis) a selective 90° RF excitation pulse $B_1$ applied in the presence of a positive $G_z$ magnetic field gradient pulse. Pulse control module 2 (FIG. 2) provides the needed control signals to the frequency synthesizer 12 and modulator 14 so that the resulting excitation pulse is of the correct phase, frequency and frequency bandwidth to excite spins only in a predetermined slice of the patient being imaged. The frequency of the synthesizer 12 is dependent nn the strength of the applied polarizing magnetic field $B_0$ and the particular NMR species being imaged in accordance with the well known Larmor equation. The pulse control module 2 also applies activating signals to the gradient power supply 7 to generate the $G_z$ magnetic field gradient pulse.

Continuing with reference to FIG. 3, $G_x$, $G_y$ and $G_z$ gradient pulses are applied simultaneously in interval 2. The $G_z$ gradient in interval 2 is a rephasing pulse typically selected such that the time integral of the $G_z$ gradient waveform over interval 2 is approximately equal to $-\frac{1}{2}$ of the time integral of the $G_z$ gradient waveform over interval 1. The function of the negative $G_z$ pulse is to rephase the spins which are excited in interval 1. The $G_y$ gradient pulse is a phase encoding pulse selected to have a different amplitude in each of Views A, B, ... etc., to encode spatial information in the direction of that gradient. The number of different $G_y$ gradient amplitudes (and, hence, the number of views in the scan) is typically selected to equal at least the number of pixel resolution elements the reconstructed image will have in the phase encoding direction (Y). Typically, 128, 256, or 512 different gradient amplitudes $G_y$ are selected and in the typical NMR system, the $G_y$ values are incremented a fixed amount from one view to the next until the NMR scan is complete.

The $G_x$ gradient pulse in interval 2 is a dephasing pulse needed to dephase the excited spins by a predetermined amount to delay the time of occurrence of a spinecho NMR signal $S_1(t)$ in interval 4. The spin echo NMR signal is produced typically by the application of a 180° selective RF excitation pulse $B_1$ which reverses the direction of dephasing so as to produce the spin echo signal. The spin echo signal is sampled in interval 4 in the presence of a gradient pulse $G_x$ to encode spatial information in the direction (X) of this gradient.

As indicated above, baseline error components can be eliminated by using an additional NMR measurement in each view. This second measurement is substantially identical to the first with the exception that the RF excitation pulse $B_1$ in interval 5 of View A is selected to be 180° out of phase (as suggested by the minus sign) relative to the RF excitation pulse $B_1$ in interval 1 of View A. As a result, the spin echo NMR signal $S_1'(t)$ in interval 8 is 180° out of phase with the NMR spin echo signal $S_1(t)$ in interval 4. If the NMR signal $S_1'(t)$ is subtracted from $S_1(t)$, only those components of the signals with reversed sign in the signal $S_1'(t)$ are retained. Any baseline error components thus cancel. This two step process may be implemented several times for each view to allow additional signal averaging. Also, under certain conditions, other techniques for eliminating baseline errors may be employed so that only one measurement cycle per view is required.

The process described above with reference to View A is repeated for View B and so on for all amplitudes of the phase encoding $G_y$ gradient. The NMR data which is collected during this scan is stored in the host computer 4 where it is processed to reconstruct image data suitable for controlling a CRT display. Referring to FIG. 1, for example, the reconstructed image would indicate by the intensity of each pixel the density of hydrogen nuclei times a factor representing $T_2$ decay and times a factor representing $T_1$ decay throughout the slice 1.

While pulse sequences such as that illustrated in FIG. 3 work for nuclei having relatively long $T_2$ relaxation constants, they do not work well for sodium nuclei. For example, the typical time interval between the application of the 90° RF excitation pulse and the acquisition of the NMR echo signal $S_1(t)$ is in the range of 20 to 100 milliseconds. Since the $T_2$ relaxation constant of the short component of sodium-23 is in the range of 0.7 to 4.8 milliseconds, it is evident that the NMR signal due to this component would be insignificant in amplitude before the NMR echo signal $S_1(t)$ is acquired.

Figure 4:
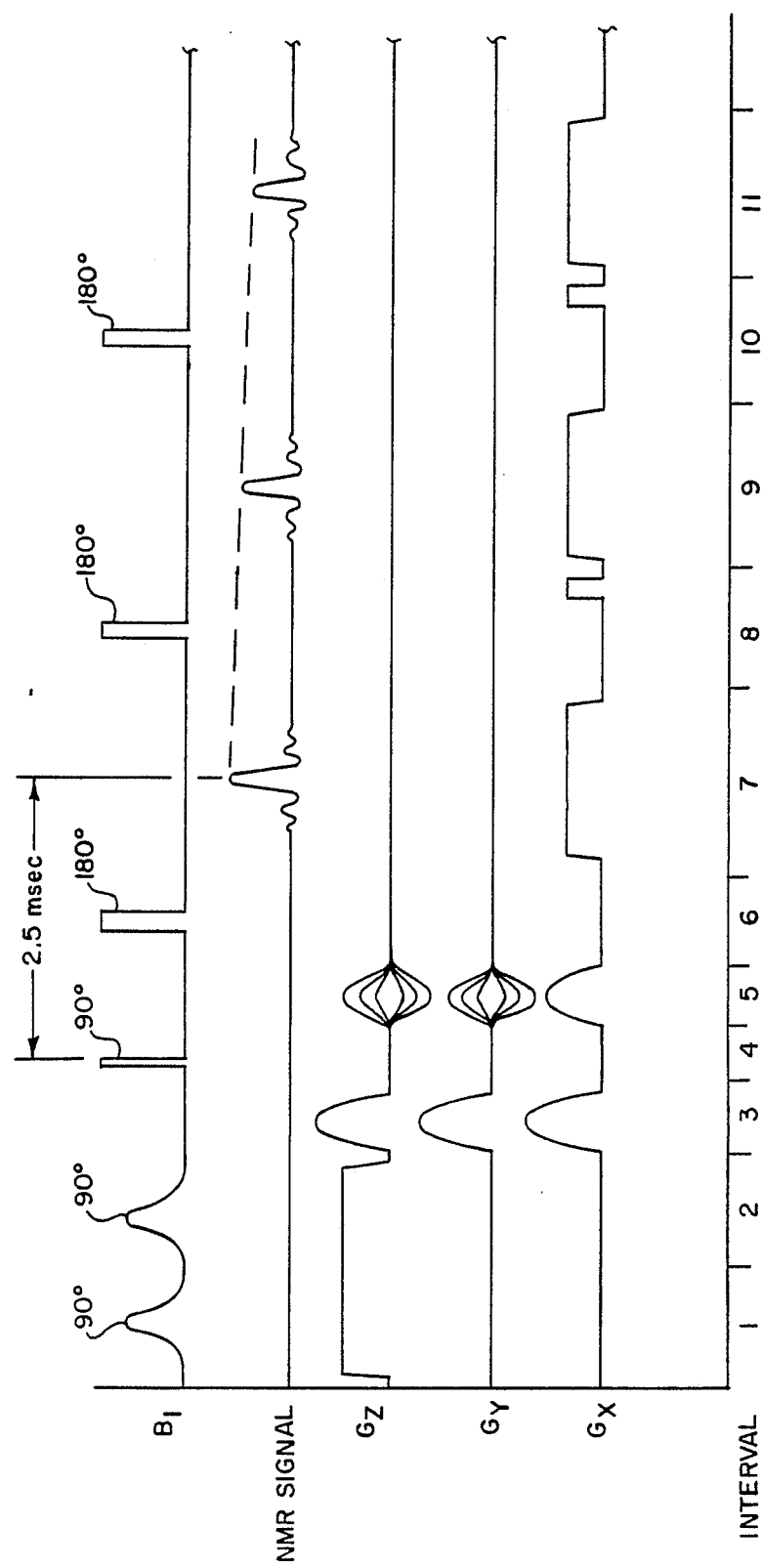
FIG. 4 is an NMR imaging pulse sequence which employs the present invention.

A pulse sequence suitable for imaging nuclei having a very short $T_2$ relaxation constant is shown in FIG. 4. The time intervals in this pulse sequence are measured in microseconds rather than milliseconds as in prior art pulse sequences.

Figure 5:
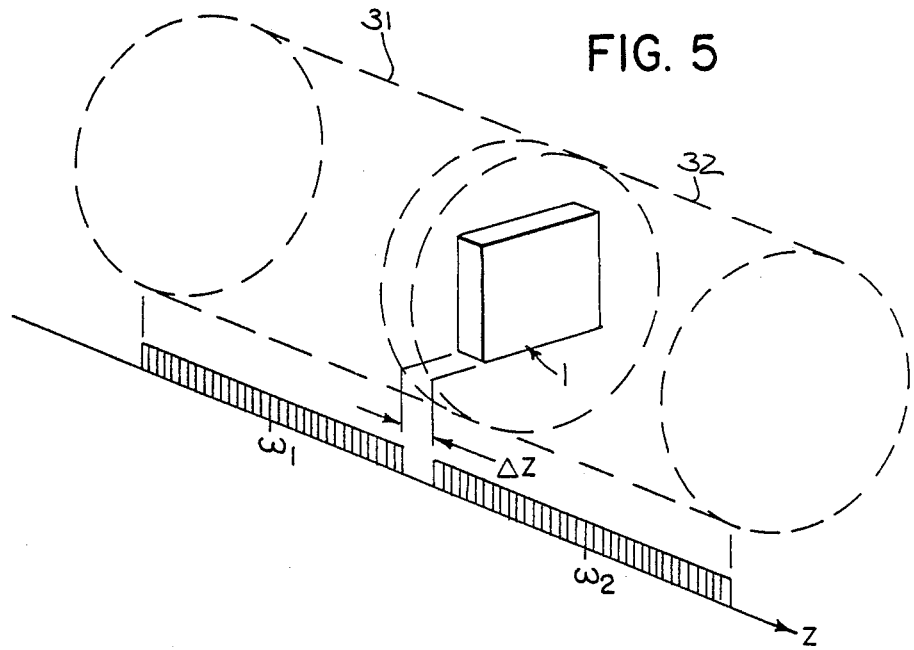
FIG. 5 is a schematic representation of the presaturation which results from the pulse sequence of FIG. 4.

The first three intervals of this pulse sequence perform a presaturation of all resonant nuclei positioned outside the selected slice 1. Referring to both FIGS. 4 and 5, a gradient $G_z$ is applied and a selective 90° RF pulse is applied during interval 1. The center frequency ($\omega_1$) and frequency bandwidth of this first RF pulse is such that nuclei lying to one side of the selected region or slice 1 are saturated. During interval 2, a second selective 90° RF pulse is applied having a center frequency ($\omega_2$) and frequency bandwidth such that nuclei lying to the other side of the region or slice 1 are saturated. During interval 3, strong magnetic field gradients are applied along all three axes to dephase the precessing nuclei. As a result, resonant nuclei in the regions 31 and 32 lying to each side of the slice 1 cannot produce an NMR signal of significant magnitude during the subsequent intervals of the pulse sequence. It should be apparent to those skilled in the art that a single, notched selective or tailored RF pulse could be used in place of the two separate selective 90° RF pulses.

Following the presaturation step, a nonselective 90° RF excitation pulse is produced during interval 4. This pulse has a frequency of 16.9 MHz (at 1.5 Tesla $B_0$) and a duration of 210 microseconds. This pulse tips all sodium nuclei within the RF coil 90° to produce a maximum amplitude NMR signal. Following this, phase encoding gradient pulses $G_z$ and $G_y$ are applied during interval 5 as well as a dephasing lobe of the frequency encoding gradient field $G_x$. The frequency encoding gradient field $G_x$ is applied during each of the subsequent intervals during which an echo NMR signal is produced.

A nonselective 180° RF echo pulse is produced during interval 6 in order to invert the magnetization and cause a RF echo to form. This produces an echo NMR signal during interval 7 which is acquired for a one millisecond time interval. The 180° RF echo pulse has a frequency of 16.9 MHz and a duration of 420 milliseconds. The time interval of 2.5 milliseconds between the nonselective 90° RF pulse and the echo NMR signal is the shortest possible interval in view of the maximum available gradient field strength and the desired spatial resolution. The maximum gradient field strength available is 10 mT/m which required gradient field pulse widths of 0.92 milliseconds in order to achieve an in slice spatial resolution of 8.8 millimeters.

Referring still to FIG. 4, in order to quantify both the long and short $T_2$ components of in vivo sodium, a total of eight nonselective 180° RF pulses are produced during the pulse sequence. These pulses are timed such that the first four NMR echo signals which result are spaced at 2.5 millisecond intervals and the last four are spaced at 5 millisecond intervals. The echo signals can be either symmetric or asymmetric in echo time. During each pulse sequence of the preferred embodiment, NMR data is acquired at TE=2.5, 5.0, 7.5, 10.0, 15.0, 20.0, 25.0 and 30.0 milliseconds. Trim pulses in the readout gradient $G_x$ are produced prior to the second and subsequent NMR echo signals. These are indicated at intervals 8 and 10 in FIG. 4, and they are chosen to insure that the gradient echo is produced in coincidence with the "Hahn" echo despite eddy currents in the subject. While such coincidence is desired to provide the most quantitatively accurate NMR echo signals, it is not necessary. Indeed, it is possible to eliminate the nonselective 180° RF pulses altogether and rely solely on the production of gradient echo signals. Such a method may provide useful information concerning the relative amount of short component sodium.

The pulse sequence of the present invention is repeated in a conventional manner to produce a set of NMR data from which a sodium density or sodium $T_2$ image can be reconstructed. In the preferred embodiment 64 phase encoding views in the y direction are acquired and 128 complex readout points are acquired in the x direction during each 1.0 millisecond data acquisition window. The pulse sequence is repeated at intervals of TR=100 milliseconds resulting in imaging times of 17 and 35 minutes depending on the number of averages employed for each view as described above with respect to FIG. 3.

Figure 6:
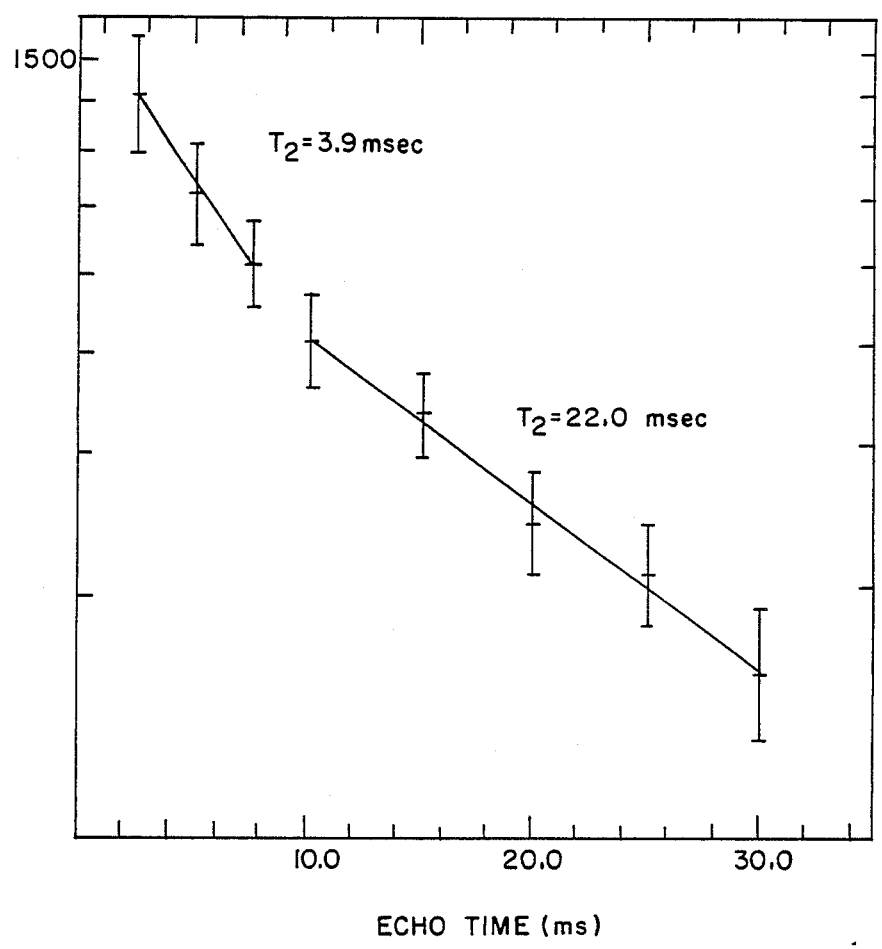
FIG. 6 is a graph showing typical measurement results when using the present invention.

The present invention has been used in a number of medical applications. For example, when rabbit VX2 carcinomas are imaged using the present invention, some are found to have a single, long $T_2$ relaxation constant, whereas others exhibit both short and long $T_2$ relaxation components. This difference appears very clearly in images reconstructed from data acquired according to the present invention and it serves as a means for distinguishing the degree of tumor progression as the necrotic tumor has more long $T_2$ sodium than the early growth modular tumor which has much more short $T_2$ sodium. The results of one view of such data is shown in FIG. 6, where the magnitudes of the echo NMR signals are plotted as a function of time. The two components of the $T_2$ relaxation of sodium-23 are clearly evident in this measurement. It is apparent from this graph that an NMR pulse sequence with an echo time greater than 7.5 milliseconds, would completely miss the short $T_2$ component of sodium and would not provide any accurate indication of the density of sodium-23.

While the present invention is particularly useful in measuring and imaging sodium-23, it should be apparent to those skilled in the art that it may also be used to more accurately measure and image other paramagnetic nuclei having very short $T_2$ relaxation constants.

I claim:

1. A method of producing an NMR signal from paramagnetic nuclei having a short $T_2$ relaxation constant, the steps comprising:
    applying a selective RF saturation pulse in combination with a magnetic field gradient to saturate paramagnetic nuclei on each side of a selected slice of paramagnetic nuclei;
    applying a nonselective RF excitation pulse to the paramagnetic nuclei in the selected slice;
    applying position encoding magnetic field gradients to the paramagnetic nuclei;
    applying a nonselective RF echo pulse to the paramagnetic nuclei in the selected slice;
    acquiring an NMR echo signal which is produced by the paramagnetic nuclei in the selected slice; and
    in which the RF excitation pulse and the RF echo pulse each have a duration less than 500 microseconds.

2. A method of producing an NMR signal from paramagnetic nuclei having a short $T_2$ relaxation constant, the steps comprising:
    applying a selective RF saturation pulse in combination with a magnetic field gradient to saturate paramagnetic nuclei on each side of a selected slice of paramagnetic nuclei;
    applying a nonselective RF excitation pulse to the paramagnetic nuclei in the selected slice;
    applying position encoding magnetic field gradients to the paramagnetic nuclei;
    applying a nonselective RF echo pulse to the paramagnetic nuclei in the selected slice;
    acquiring an NMR echo signal which is produced by the paramagnetic nuclei in the selected slice; and
    in which the RF excitation pulse and the RF echo pulse are each applied to the paramagnetic nuclei as two substantiall orthogonal excitation fields.

3. A method of producing an NMR signal from paramagnetic nuclei having a short $T_2$ relaxation constant, the steps comprising:
    applying a selective Rf saturation pulse in combination with a magnetic field gradient to saturate paramagnetic nuclei on each side of a selected slice of paramagnetic nuclei;
    applying a nonselective RF excitation pulse to the paramagnetic nuclei in the selected slice;
    applying position encoding magnetic field gradients to the paramagnetic nuclei;
    applying a nonselective RF echo pulse to the paramagnetic nuclei in the selected slice;
    acquiring an NMR echo signal which is produced by the paramagnetic nuclei in the selected slice; and
    in which the paramagnetic nuclei are sodium nuclei.

4. A method of producing an NMR signal from paramagnetic nuclei having a short $T_2$ relaxation constant, the steps comprising:
    applying a selective RF saturation pulse in combination with a magnetic field gradient to saturate paramagnetic nuclei on each side of a selected slice of paramagnetic nuclei;
    applying a nonselective RF excitation pulse to the paramagnetic nuclei in the selected slice;
    applying position encoding magnetic field gradients to the paramagnetic nuclei;
    applying a nonselective RF echo pulse to the paramagnetic nuclei in the selected slice;
    acquiring an NMR echo signal which is produced by the paramagnetic nuclei in the selected slice; and
    in which a set of nonselective RF echo pulses are applied to the paramagnetic nuclei in the selected slice and a corresponding set of NMR echo signals are acquired at a plurality of time intervals following the nonselective RF excitation pulse.

5. The method as recited in claim 4 in which a trim gradient pulse is applied after the application of each of the second and subsequent nonselective RF echo pulses.

6. A method of producing an NMR signal from paramagnetic nuclei having a short $T_2$ relaxation constant, the steps comprising:
    applying a selective RF saturation pulse in combination with a magnetic field gradient to saturate paramagnetic nuclei on each side of a selected slice of paramagnetic nuclei;
    applying a nonselective RF excitation pulse to the paramagnetic nuclei in the selected slice;
    applying position encoding magnetic field gradients to the paramagnetic nuclei;
    applying a magnetic field gradient which causes the paramagnetic nuclei in the selected slice to rephase and emit an NMR echo signal;
    acquiring the NMR echo signal which is produced by the paramagnetic nuclei in the presence of said magnetic field gradient; and
    in which the paramagnetic nuclei are sodium nuclei.

* * * * *